(12) United States Patent
McCormick et al.

(10) Patent No.: US 7,468,211 B2
(45) Date of Patent: Dec. 23, 2008

(54) PROTECTED POLYMERIC FILM

(75) Inventors: Fred B. McCormick, Maplewood, MN (US); Manoj Nirmal, St. Paul, MN (US); George V. Tiers, St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 0 days.

(21) Appl. No.: 12/136,835

(22) Filed: Jun. 11, 2008

(65) Prior Publication Data

US 2008/0241506 A1 Oct. 2, 2008

Related U.S. Application Data

(63) Continuation of application No. 10/948,013, filed on Sep. 23, 2004, now abandoned.

(51) Int. Cl.
B32B 9/00 (2006.01)

(52) U.S. Cl. .................. 428/451; 428/458; 428/469; 428/698; 428/701; 428/702

(58) Field of Classification Search .......... 428/451, 428/458, 469, 698, 701, 702
See application file for complete search history.

(56) References Cited

U.S. PATENT DOCUMENTS

| | | | |
|---|---|---|---|
| 5,047,687 A | 9/1991 | VanSlyke | |
| 5,188,901 A | 2/1993 | Shimizu | |
| 5,440,446 A | 8/1995 | Shaw et al. | |
| 5,607,789 A | 3/1997 | Treger et al. | |
| 5,652,067 A | 7/1997 | Ito et al. | |
| 5,686,360 A | 11/1997 | Harvey, III et al. | |
| 5,739,545 A | 4/1998 | Guha et al. | |
| 5,811,177 A | 9/1998 | Shi et al. | |
| 5,882,761 A | 3/1999 | Kawami et al. | |
| 5,952,778 A | 9/1999 | Haskal et al. | |
| 6,146,225 A | 11/2000 | Sheats et al. | |
| 6,226,890 B1 | 5/2001 | Boroson et al. | |
| 6,284,342 B1 | 9/2001 | Ebisawa et al. | |
| 6,383,048 B1 | 5/2002 | Yang et al. | |
| 6,413,645 B1 | 7/2002 | Graff et al. | |
| 6,497,598 B2 | 12/2002 | Affinito | |
| 6,696,157 B1 | 2/2004 | David et al. | |

(Continued)

FOREIGN PATENT DOCUMENTS

EP 0 741 419 6/1996

(Continued)

OTHER PUBLICATIONS

Chen, C.H., et al., Macromol. Symp. 125, 1 (1997).

(Continued)

*Primary Examiner*—D. S Nakarani
(74) *Attorney, Agent, or Firm*—Lance Vletzke

(57) ABSTRACT

A protected polymeric film comprises a polymeric film substrate having a first major surface and a second major surface opposite the first major surface, and a protective structure provided on at least the first major surface of the substrate, wherein the protective structure comprises a layer of boron oxide and an inorganic barrier layer. A protective structure may also be provided on the second major surface of the substrate. Organic electronic components may be formed on or attached to the protected polymeric films.

10 Claims, 2 Drawing Sheets

U.S. PATENT DOCUMENTS

| | | |
|---|---|---|
| 7,342,356 B2 | 3/2008 | McCormick et al. |
| 2001/0041268 A1 | 11/2001 | Arai et al. |
| 2002/0052752 A1 | 5/2002 | Landesmann |
| 2002/0068143 A1 | 6/2002 | Silvernail et al. |
| 2002/0135296 A1 | 9/2002 | Aziz et al. |
| 2003/0071567 A1 | 4/2003 | Eida |
| 2003/0164677 A1 | 9/2003 | Miyaguchi et al. |
| 2004/0046500 A1 | 3/2004 | Stegamat et al. |
| 2004/0135503 A1 | 7/2004 | Handa |
| 2004/0195960 A1 | 10/2004 | Czeremuszkin et al. |
| 2004/0209126 A1 | 10/2004 | Ziegler et al. |

FOREIGN PATENT DOCUMENTS

| | | |
|---|---|---|
| EP | 0 777 280 | 6/1997 |
| EP | 0 777 281 | 7/2001 |
| EP | 1 227 527 | 7/2002 |
| JP | 60-219042 | 10/1960 |
| JP | 5600639 | 1/1981 |
| JP | 2000-223264 | 8/2000 |
| JP | 2001-1326071 | 11/2001 |
| JP | 2002-123017 | 4/2002 |
| JP | 2002-299040 | 10/2002 |
| WO | WO 00/06661 | 6/2000 |
| WO | WO 01/05205 | 1/2001 |
| WO | WO 01/39287 | 5/2001 |
| WO | WO 01/89006 | 11/2001 |
| WO | WO 2004/030115 | 4/2004 |
| WO | WO 2005/015655 | 2/2005 |

OTHER PUBLICATIONS

Fujikawa, H., et al., *Energy Structures of Triphenylamine Oligomers*, Synthetic Metals, 91, 161 (1997).

Grazulevicius, J.V., et al., *Charge-Transporting Polymers and Molecular Glasses*, Handbook of Advanced Electronic and Photonic Materials and Devices, H.S. Nalwa (ed.), 10 233-274 (2001).

Office Action from related case, U.S. Appl. No. 10/948,011, dated Apr. 4, 2007.

Office Action from related case, U.S. Appl. No. 10/948,011, dated Mar. 8, 2007.

Office Action from related case, U.S. Appl. No. 10/948,011, dated Jan. 25, 2007.

Office Action from related case, U.S. Appl. No. 10/948,011, dated Aug. 14, 2006.

Office Action from related case, U.S. Appl. No. 10/948,011, dated Jun. 26, 2006.

Notice of Allowance from related case, U.S. Appl. No. 10/948,011, dated Jul. 26, 2007.

PROTECTED POLYMERIC FILM

CROSS REFERENCE TO RELATED APPLICATIONS

This is a continuation of application Ser No. 10/948,013, filed Sep. 23, 2004, now abandoned the disclosure of which is incorporated herein by reference as if fully set forth.

TECHNICAL FIELD

This invention relates to protected polymeric films and, more particularly, to polymeric films that have a reduced tendency to transmit moisture. This invention also relates to articles that incorporate such protected polymeric films.

BACKGROUND

Polymeric films tend to transmit moisture (e.g., water vapor), which can be undesirable if the transmission of moisture is detrimental to components that are secured to or subsequently formed on the film. As one example, organic electroluminescent devices may suffer reduced output or premature failure when exposed to moisture. Techniques have been developed to encapsulate and prolong the life of such devices, which may be sufficient if the device is formed on a glass substrate that is impermeable to moisture. Increasingly, however, it is desirable to form such devices on a polymeric film, but such films tend to inherently transmit moisture. A protected polymeric film that exhibited low permeability to moisture would be especially useful, but despite intense industrial effort to develop such a film, only limited success has been attained so far.

SUMMARY OF THE INVENTION

In one aspect, the present invention provides a protected polymeric film comprising a polymeric film substrate having a first major surface and a second major surface opposite the first major surface, and a protective structure that is provided on at least the first major surface of the substrate. The protective structure comprises a layer of boron oxide and an inorganic barrier layer. The layer of boron oxide may be disposed on the first major surface of the substrate with the inorganic barrier layer disposed over the layer of boron oxide. Alternatively, the inorganic barrier layer may be disposed on the first major surface of the substrate with the layer of boron oxide disposed over the inorganic barrier layer. A second protective structure (also comprising a layer of boron oxide and an inorganic barrier layer) may be provided on the second major surface of the substrate. The expressions "disposed on" and "disposed over" are not meant to suggest that direct, intimate contact is required between the layers that are in this relationship, but instead are relative terms of position.

In some embodiments, the inorganic barrier layer cooperates with the first major surface of the substrate to encapsulate the layer of boron oxide. In other embodiments, the protective structure further comprises a second inorganic barrier layer. The layer of boron oxide may then be disposed between, and optionally be encapsulated by, the two inorganic barrier layers.

The inorganic barrier layer preferably comprises an inorganic oxide, boride, nitride, carbide, oxynitride, oxyboride, or oxycarbide, such as silicon oxides, nitrides or carbides; diamond-like carbon layers; and metals such as silicon, aluminum or combinations thereof. Specific examples include silicon oxide (monoxide or dioxide), silicon nitride, aluminum oxide or silicon aluminum oxide. The inorganic barrier layer may be a multilayer construction comprising, for example, alternating polymeric and inorganic layers. In some instances, the inorganic barrier layer has low moisture permeability.

Protected polymeric films according to the invention may further, and optionally, comprise a buffer layer such as an organometallic compound or a chelate compound. In these embodiments, the inorganic barrier layer may be disposed on the first major surface of the substrate, the layer of boron oxide may be disposed over the inorganic barrier layer, and the buffer layer may be disposed over the layer of boron oxide.

The protective structures reduce the inherent, but potentially undesirable, tendency of polymeric films to transmit moisture. As a result, the protected polymeric films of the invention provide a good support on which an electroluminescent assembly (e.g., comprising a first electrode, a second electrode, and a light emitting structure disposed between the first and second electrodes) may be subsequently formed or attached. The electroluminescent assembly may be disposed on the surface of the polymeric film carrying the protective structure (either underneath it or over it), or on the opposite surface of the polymeric film.

In another aspect, the present invention provides a method for reducing the transmission of moisture by a polymeric film by applying a protective structure, such as those described above, to at least a first major surface of the polymeric film.

BRIEF DESCRIPTION OF THE DRAWINGS

The invention will be more fully appreciated with reference to the following non-limiting and not-to-scale drawings in which the same reference symbols designate like or analogous components throughout and in which.

DETAILED DESCRIPTION

Figure 1:
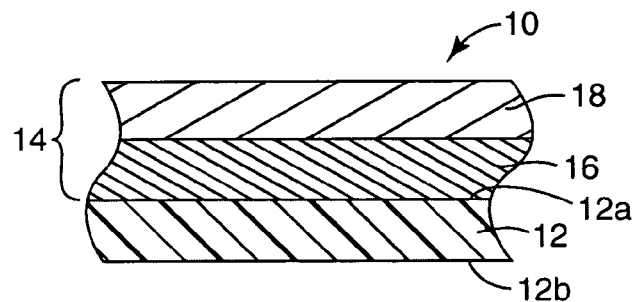
FIG. 1 is a schematic sectional view of a first embodiment of a protected polymeric film according to the invention.

Broadly, and in one aspect, the invention provides a protected polymeric film comprising a polymeric film substrate having a first major surface and a second major surface opposite the first major surface, and a protective structure that is provided on at least the first major surface of the substrate. The protective structure comprises a layer of boron oxide and an inorganic barrier layer. Other layers may be optionally included in the protective structure, on the polymeric film substrate, or both.

The protected polymeric films of the invention can be used to inhibit the transmission of moisture in a variety of applications. They are especially useful as substrates for use with organic electronic devices such as organic electroluminescent devices, organic transistors, liquid crystal displays, and other electronic components.

Broadly, a "protected polymeric film" refers to a polymeric film substrate that has been provided with a protective structure as described herein, and a "protective structure" refers to the layer of boron oxide and the inorganic barrier layer that have been provided on the polymeric film substrate. Polymeric film substrates tend to transmit, or otherwise be permeable to moisture, which is undesirable if the transmission of moisture by the substrate is detrimental to components that are secured to or subsequently formed on the substrate.

Thus, a "protected polymeric film" more specifically refers to a polymeric film substrate that has a reduced ability to transmit moisture relative to the same polymeric film substrate that does not have the protective structure. Similarly, a "protective structure" more specifically refers to a layered assembly comprising the layer of boron oxide and the inorganic barrier layer, and which reduces the undesirable, but inherent, tendency of a polymeric film to transmit moisture relative to the same polymeric film that does not have the protective structure. The protective structure is preferably adapted to reduce, often substantially, the inherent tendency of a polymeric film to transmit moisture through the surface(s) to which the protective structure has been applied.

Preferably, the protective structure results in protected polymeric films that have sufficiently low moisture permeability to make them useful for encapsulating at least the anode, cathode and organic electronic layers of organic electronic devices. "Encapsulating" means surrounding or enclosing the exposed moisture sensitive surfaces of these layers. Organic electronic devices typically require protection from moisture in excess of the levels that can be measured by commercially available equipment such as that provided by MOCON (Modern Controls, Minneapolis, Minn.). While MOCON equipment is typically capable of measuring moisture permeation rates as low as $5 \times 10^{-4}$ grams/square meter/day ($g/m^2/day$), permeation rates as low as $1 \times 10^{-6}$ $g/m^2/day$ have been described as a desirable target. Accordingly, "low moisture permeability" more preferably means a moisture permeation rate of less than $5 \times 10^{-4}$ $g/m^2/day$, more preferably less than $1 \times 10^{-5}$ $g/m^2/day$, even more preferably less than $1 \times 10^{-6}$ $g/m^2/day$ as measured pursuant to ASTM Test Method F-1249.

Turning now to the drawings, FIG. 1 shows a protected polymeric film 10 comprising a polymeric film substrate 12 having a first major surface 12a and a second major surface 12b opposite the first major surface 12a. A protective structure 14 is provided on at least the first major surface 12a of substrate 12. Protective structure 14 comprises a layer of boron oxide 16 and an inorganic barrier layer 18. Preferably, there are no intervening layers between substrate 12 and protective structure 14 as this could impair the ability of the protective structure to reduce the transmission of moisture through the substrate. Similarly, it is preferred that there be no intervening layers between boron oxide layer 16 and inorganic barrier layer 18 as this too could impair the ability of protective structure 14 to reduce the transmission of moisture by substrate 12.

FIG. 1 illustrates boron oxide layer 16 as being intermediate substrate 12 and inorganic barrier layer 18; however, the relative position of these two layers could be reversed such that inorganic barrier layer 18 is intermediate substrate 12 and boron oxide layer 16. Preferred are those constructions in which the inorganic barrier layer and the boron oxide layer are arranged such that encroaching moisture encounters the inorganic barrier layer before encountering the boron oxide layer.

Substrate 12 is a polymeric film. By "film" is meant a material having length and width dimensions that are substantially greater than the material's thickness. Included within the concept of a "film" are a tape, a ribbon and a roll, which generally describe a material that also has a length dimension that is substantially greater than its width, the width also being substantially greater than the thickness. Such materials are often provided with a central core about which the material is wrapped in multiple windings so as to facilitate processing steps during which the protective structure is applied to the substrate (e.g., in roll-to-roll production), additional manufacturing operations, or post-processing handling, storage and shipping. Also included within the concept of a "film" is a sheet, page or panel, which generally describe a material that has length and width dimensions that are more nearly equal. Such materials are often handled in a stack of multiple individual layers that facilitate processing steps during which the protective structure is applied to the substrate in a sheet-fed or a similar sheeting type operation.

The term "polymeric" refers to homopolymers and copolymers, as well as homopolymers or copolymers that may be formed in a miscible blend, for example, by coextrusion or by reaction, including, e.g., transesterification. The term "copolymer" describes materials that are derived from two or more different monomeric units and includes random, block and graft copolymers. Polymers suitable for providing substrate 12 may be any of a number of known polymers such as thermoset (crosslinked), thermosettable (crosslinkable), or thermoplastic polymers that are capable of being formed into a film, including acrylates (including methacrylates such as polymethylmethacrylate), polyols (including polyvinyl alcohols), epoxy resins, silanes, siloxanes (with all types of variants thereof), polyvinyl pyrrolidones, polyimides, polyamides, poly (phenylene sulphide), polysulfones, phenol-formaldehyde resins, cellulose ethers and esters (for example, cellulose acetate, cellulose acetate butyrate, etc.), nitrocelluloses, polyurethanes, polyesters (for example, poly (ethylene terephthalate), poly (ethylene naphthalate)), polycarbonates, polyolefins (for example, polyethylene, polypropylene, polychloroprene, polyisobutylene, polytetrafluoroethylene, polychlorotrifluoroethylene, poly (p-chlorostyrene), polyvinylidene fluoride, polyvinylchloride, polystyrene, poly α-methyl styrene, etc.), phenolic resins (for example, novolak and resole resins), polyvinylacetates, styrene/acrylonitriles, styrene/maleic anhydrides, polyoxymethylenes, polyvinylnaphthalenes, polyetheretherketones, polyaryletherketones, fluoropolymers, polyarylates, polyphenylene oxides, polyetherimides, polyarylsulfones, polyethersulfones, polyamideimides, and polyphthalamides.

For some applications it may be desirable for substrate 12 to have a visible light transmission, for example a transmission of at least about 70%, at a visible light wavelength of interest. In other applications it may be desirable for the substrate to be oriented, biaxially oriented and/or heat-stabilized. In some cases, it may be desirable for substrate 12 to be flexible, by which it is meant that substrate 12 can be wrapped about a core to produce a roll having multiple windings as described above. The thickness of substrate 12 is largely dictated by the intended application for the protected polymeric film, but for many uses a thickness of about 0.01 to 1 mm, more preferably about 0.05 to 0.25 mm is quite useful.

With continued reference to FIG. 1, protective structure 14 comprises a layer of boron oxide 16 and an inorganic barrier layer 18. Several advantages are associated with using boron oxide in the present invention, although it will be understood that not every advantage will necessarily be reflected in each application that incorporates the protected polymeric films of the invention. Boron oxide may be deposited on or otherwise applied to the polymeric film substrate as an optically clear or transparent glass-like material, which may be advantageous for applications where this layer needs to be transmissive to light such as in an organic electroluminescent device. In addition, the boron oxide layer may reduce the inherent tendency of a polymeric film substrate to transmit moisture, whether emanating from the ambient environment or from components formed on or attached to the substrate.

While not wishing to be bound by a particular theory, it is believed that the boron oxide functions as a desiccant, scavenging moisture by reacting with it to yield boric acid, a relatively weak acid the solid form of which is not likely to be detrimental to many of the components that may be formed on or attached to the substrate. This can be represented by the reaction of one molecule of boron oxide with three molecules of water, $B_2O_3+3H_2O\rightarrow 2B(OH)_3$. Additional reaction products in the form of evolved gasses or liquids are not liberated.

Boron oxide also offers certain processing advantages that may be desirable depending upon the application. For example, boron oxide may be applied to the polymeric film substrate by several techniques including sputtering, chemical vapor deposition, electron beam deposition, and thermal evaporation (e.g., vapor deposition). Vapor deposition is a preferred method when the target surface is susceptible to damage from more energetic application methods such as sputtering. Desirably, boron oxide can be vapor deposited at an acceptable rate under moderate conditions (e.g., deposition rates of about 10 to 50 Å/sec may be achieved under a vapor pressure of about $10^{-6}$ to $10^{-4}$ Torr), without showing signs of decomposition (e.g., discoloration of the source material).

Boron oxide layer 16 is provided on that portion of polymeric film substrate 12 that is intended to be protected against moisture transmission and will be determined by the individual application. The thickness of boron oxide layer 16 will also vary substantially depending upon the nature of the application for protected polymeric film 10, moisture conditions to which the protected polymeric film is likely to be exposed during use, other layers present in protective structure 14, requirements for optical transparency and mechanical flexibility of the protected polymeric film, cost, etc. As layer thickness increases, resistance to moisture transmission will increase, but perhaps at the expense of reduced transparency, reduced flexibility, and increased cost. Within these guidelines boron oxide layer 16 is provided at an effective thickness, by which is meant a thickness sufficient to reduce the undesirable, but inherent, tendency of a polymeric film to transmit moisture relative to the same polymeric film that does not have the boron oxide layer. More specifically, the boron oxide layer is preferably provided at a thickness of about 50 Å to 10,000 Å, more preferably about 500 Å to 5,000 Å, and even more preferably about 3,000 Å to 5,000 Å.

Still referring to FIG. 1, protective structure 14 also comprises inorganic barrier layer 18, which cooperates with boron oxide layer 16 to protect polymeric film substrate 12. Inorganic barrier layer 18 may provide protection against exposure to moisture, oxygen, and heat and/or mechanical impact, although it is most often included as a moisture and/or oxygen barrier. In this capacity, it is preferred that inorganic barrier layer 18 be selected to result in a polymeric film having low moisture permeability. It is also preferred that inorganic barrier layer 18 not be reactive with boron oxide layer 16, polymeric film substrate 12, other layers adjacent to the inorganic barrier layer, and any components formed on or attached to the polymeric film substrate. In certain applications it may be desirable for inorganic barrier layer 18 to be deposited or otherwise applied as an optically clear or transparent material, which may be advantageous for applications where this layer needs to be transmissive to light such as in an organic electroluminescent device.

A variety of materials may be employed as the inorganic barrier layer. Preferred inorganic barrier layer materials include metals, metal oxides, metal nitrides, metal carbides, metal oxynitrides, metal oxyborides, metal oxycarbides, and combinations thereof, e.g., silicon oxides such as silica, aluminum oxides such as alumina, titanium oxides such as titania, indium oxides, tin oxides, indium tin oxide, tantalum oxide, zirconium oxide, niobium oxide, boron carbide, tungsten carbide, silicon carbide, aluminum nitride, silicon nitride, boron nitride, aluminum oxynitride, silicon oxynitride, silicon oxycarbide, boron oxynitride, zirconium oxyboride, titanium oxyboride, and combinations thereof. Indium tin oxide, silicon oxide, aluminum oxide and combinations thereof are especially preferred inorganic barrier materials.

The inorganic barrier layer may be applied or formed using techniques employed in the film metallizing art such as sputtering (e.g., cathode or planar magnetron sputtering), evaporation (e.g., resistive or electron beam evaporation), chemical vapor deposition, plating and the like. Materials suitable for inorganic barrier layer 18 depend partly on the protective function that it is intended to play, but glass and inorganic oxides (e.g., oxides of silicon, aluminum or combinations thereof, such as silicon monoxide, silicon dioxide, aluminum oxide or silicon aluminum oxide) are quite useful. Further examples of inorganic barrier layers useful in this invention include materials fabricated using Plasma Enhanced Chemical Vapor Deposition (PE-CVD), such as those described in U.S. Pat. No. 6,696,157 (David).

In another embodiment, inorganic barrier layer 18 may be provided by a multilayer construction comprising, for example, alternating polymeric and inorganic layers. The inorganic layers may be provided by any of the materials noted above for the inorganic barrier layer, and the polymeric layers may be, for example, (meth)acrylates, polyesters, fluorinated polymers, parylenes, cyclotenes, or polyalkylenes. Multilayer constructions may be prepared by way of a "PML" (i.e., polymer multilayer) process, or other techniques in which the layers are applied, as appropriate, by sputtering, spin-coating, thermal evaporation, chemical vapor deposition, etc. Suitable examples of multilayer constructions are described in, for example, U.S. Pat. No. 5,440,446 (Shaw), U.S. Pat. No. 6,497,598 (Affinito), European Patent Publication No. 0 777 280 A2 (Motorola), WO 01/89006 A1 (Battelle Memorial Institute), and U.S. Patent Publication No. 2002/0068143 (Silvernail, et al.).

The thickness of inorganic barrier layer 8 will also vary substantially depending upon the nature of the application for protected polymeric film 10, moisture/air conditions to which the protected polymeric film is likely to be exposed during use, other layers present in protective structure 14, requirements for optical transparency and mechanical flexibility of the protected polymeric film, cost, etc. As layer thickness increases, resistance to moisture transmission will increase, but perhaps at the expense of reduced transparency, reduced flexibility, and increased cost. Within these guidelines inorganic barrier layer 18 is provided at an effective thickness, by which is meant a thickness sufficient to increase the ability of the polymeric film to resist transmission of moisture, resist thermal and/or mechanical impact, etc. relative to the same polymeric film that does not have a protective structure that includes the inorganic barrier layer. More specifically, the inorganic barrier layer is preferably provided at a thickness of about 0.5 µm to 70 µm, more preferably about 1.5 µm to 40 µm, and even more preferably about 3.5 µm to 30 µm.

The embodiment of protected polymeric film 10 shown in FIG. 1, where boron oxide layer 16 is intermediate inorganic barrier layer 18 and polymeric film substrate 12 (i.e., encroaching moisture encounters the inorganic barrier layer before encountering the boron oxide layer), offers certain advantages. This arrangement permits boron oxide layer 16 to be deposited in an essentially continuous layer, but without the need to rigorously avoid forming pinholes and other similar defects that frequently accompany vapor deposition and other processes because inorganic barrier layer 18 also resists moisture transmission and is the layer that first encounters encroaching moisture (relative to the boron oxide layer). This arrangement also permits boron oxide layer 16 to provide a "last line of defense" in reducing moisture transmission by polymeric film substrate 12.

Figure 2:
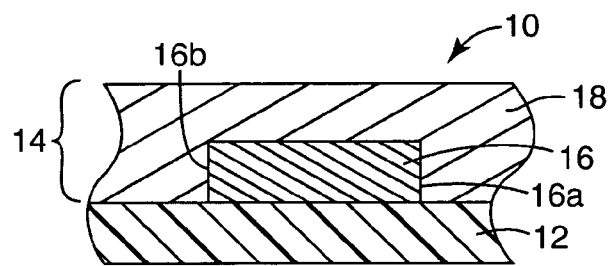
FIG. 2 is a schematic sectional view of a second embodiment of a protected polymeric film according to the invention.

Turning now to FIG. 2, another embodiment of a protected polymeric film 10 is illustrated which is similar to the embodiment of FIG. 1, but offering the further advantage that inorganic barrier layer 18 encapsulates or seals lateral side edges 16a and 16b of boron oxide layer 16 so as to additionally protect this layer from being exposed to moisture at its edges. This embodiment may be particularly useful in higher moisture environments or where the boron oxide layer 16 is to be made available to only resist the transmission of moisture that has penetrated inorganic barrier layer 18.

Figure 3:
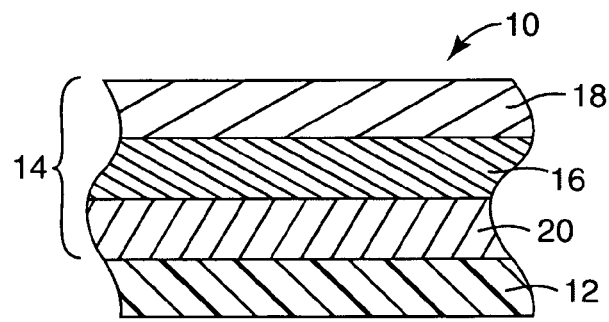
FIG. 3 is a schematic sectional view of a third embodiment of a protected polymeric film according to the invention.
Figure 4:
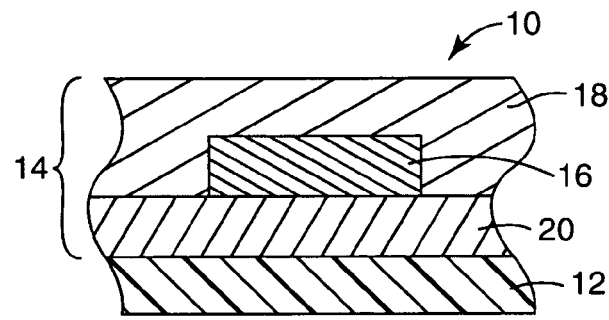
FIG. 4 is a schematic sectional view of a fourth embodiment of a protected polymeric film according to the invention.

The embodiment of FIG. 3 is similar to the embodiment of FIG. 1 but further comprises a second inorganic barrier layer 20 that is disposed between boron oxide layer 16 and polymeric film substrate 12. Second inorganic barrier layer 20 is similar to inorganic barrier layer 18, and the foregoing discussion of inorganic barrier layer 18 is applicable to second inorganic barrier layer 20. The embodiment of FIG. 3 offers the additional advantage of giving enhanced protection to polymeric film substrate 12 as a result of second inorganic barrier layer 20. The embodiment of FIG. 4 is similar to the embodiment of FIG. 2 but further comprises a second inorganic barrier layer 20 like that shown in FIG. 3. Thus, in FIG. 4, inorganic barrier layers 18 and 20 cooperate to encapsulate or seal boron oxide layer 16 so as to additionally protect this layer from being exposed to moisture at its edges.

Figure 5:
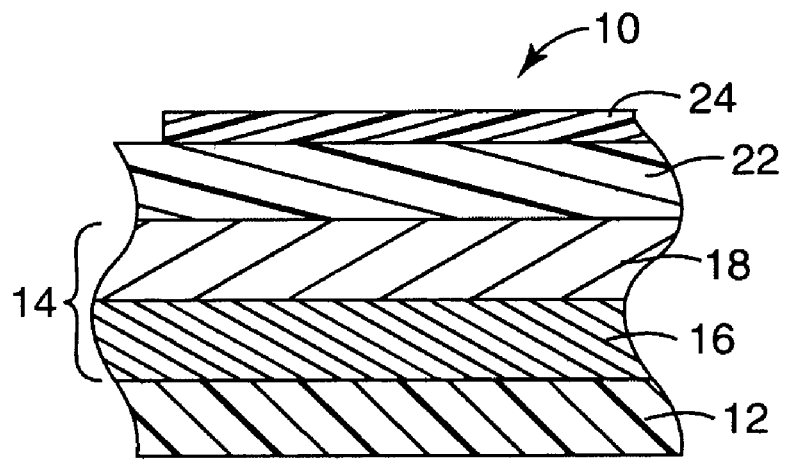
FIG. 5 is a schematic sectional view of a fifth embodiment of a protected polymeric film according to the invention.

Turning now to FIG. 5, another embodiment of a protected polymeric film 10 is presented which is similar to the embodiment shown in FIG. 1 but further comprising an optional buffer layer 22. A buffer layer refers to a layer that separates the protective structure from components or other layers that are secured to or subsequently formed on the substrate, such components or layers being generically represented by reference numeral 24 in FIG. 5. The buffer layer may provide a wide variety of possible functions, depending upon the use to which the protected polymeric film is put. For example, the buffer layer may provide a smooth surface on which components or other layers may be secured or subsequently formed. It may provide an anchoring or priming layer that improves the adhesion of subsequently formed or secured components or layers. The buffer layer may protect any subsequently formed or secured components or layers from reaction with the inorganic barrier layer or the boron oxide layer. The buffer layer may perform an optical function, and may be electrically active.

The buffer layer may be formed from a wide variety of materials, both organic and inorganic, and the actual selection will be influenced by the particular function or functions that the buffer layer is intended to serve. For example, if electronic components, or layers that form a portion of an electronic component, will be formed on or secured to the polymeric film substrate, materials that are not oxidizing agents, not hygroscopic, not acidic, and that are non-reactive with the electronic components or layers might be preferred.

In one application, protected polymeric films according to the invention are useful as substrates for supporting organic electronic components, including organic electroluminescent devices (e.g., organic light emitting diodes), etc. In this instance, the buffer layer may be formed of materials used to provide any of the electrically active layers in such components, such as copper phthalocyanine (CuPc), 4,4',4"-tris(N-3-methylphenyl-N-phenylamino)triphenylamine (MT-DATA), N,N'-bis(3-naphthalen-2-yl)-N,N'-bis(phenyl)benzidine (NPD), tris(8-hydroxyquinoline) aluminum (ALQ), gold, silicon monoxide, etc.

The thickness of the buffer layer also depends on the function that the buffer layer is intended to serve, but thicknesses in the range of about 500 Å to 2,000 Å have generally been found to be useful.

Figure 6:
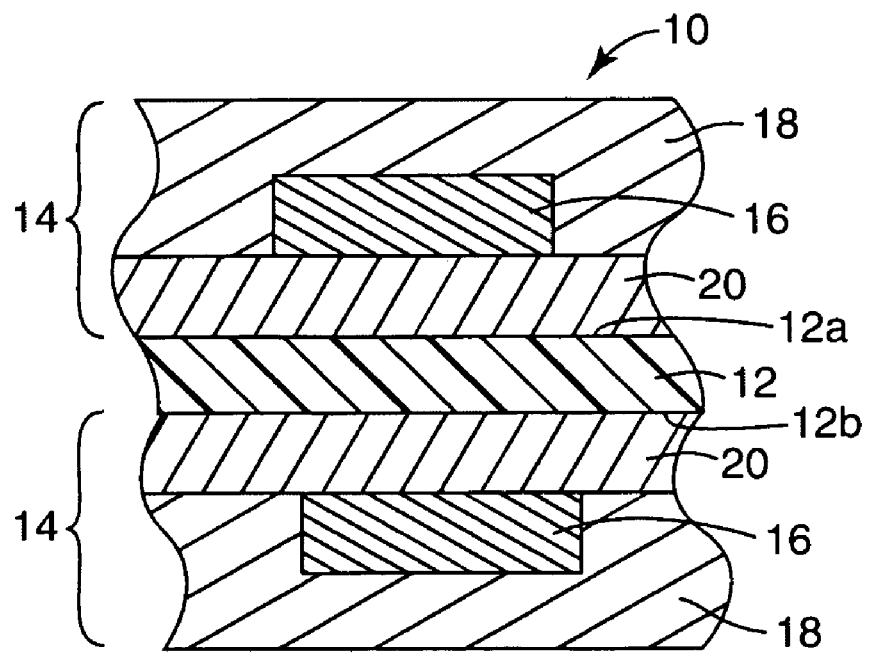
FIG. 6 is a schematic sectional view of a sixth embodiment of a protected polymeric film according to the invention.

FIG. 6 illustrates an embodiment in which both first major surface 12a and second major surface 12b of polymeric film substrate 12 have been provided with a protective structure 14 comprising a layer of boron oxide 16 and an inorganic barrier layer 18. The embodiment of FIG. 6 further includes a second inorganic barrier layer 20 associated with each protective structure, although it will be understood that the second inorganic barrier layer is optional and may be excluded from one or both protective structures. Similarly, while FIG. 6 shows each layer of boron oxide 16 as having been encapsulated by the inorganic barrier layers, this is only optional.

Though not shown in the drawings, various functional layers or coatings can be added to the protected polymeric films of the invention to alter or improve their physical or chemical properties, particularly at the surface of the film. Such layers or coatings may include, for example, visible light-transmissive conductive layers or electrodes (e.g., of indium tin oxide); antistatic coatings or films; flame retardants; UV stabilizers; abrasion resistant or hardcoat materials; optical coatings or filters; anti-fogging materials; magnetic or magneto-optic coatings or films; photographic emulsions; prismatic films; holographic films or images; adhesives such as pressure sensitive adhesives or hot melt adhesives; primers to promote adhesion to adjacent layers; and low adhesion backsize materials for use when the barrier assembly is to be used in adhesive roll form. These functional components can be incorporated into one or more of the outermost layers of the barrier assembly or can be applied as a separate film or coating.

The invention will now be described with reference to the following non-limiting examples, in which all parts and percentages are by weight unless otherwise indicated.

EXAMPLES

Unless otherwise indicated, the following abbreviations are used in the examples.

| Abbreviation | Description |
| --- | --- |
| $B_2O_3$ | Boron oxide, 99.9995%, 200 ppm $H_2O$, available from Alfa Aesar, Ward Hill, MA as stock # 11160 |
| FTCNQ | Tetrafluoro-tetracyanoquinodimethane available from Tokyo Kasei Kogyo Co., Tokyo, Japan |

-continued

| Abbreviation | Description |
| --- | --- |
| Al | Puratronic aluminum shots, 99.999%, available from Alfa Aesar, Ward Hill, MA |
| AlQ | Tris(8-hydroxyquinoline) aluminum available from H. W. Sands Corp, Jupiter, FL |
| C545T | Coumarin available from Eastman Kodak Co., Rochester, NY as Coumarin 545T |
| SR399 | Dipentaaerithritol penta acrylate available from Sartomer Company, Exton, PA as SR339 |
| β-CEA | β-carboxyethyl acrylate available from UCB Radcure Inc., N. Augusta, SC, as BCEA |
| EHPE3150 | Alicyclic epoxy resin available from Daicel Chemical Industries, Fort Lee, NJ, as Polyester EHPE3150 |
| Ebecryl 629 | Epoxy novolac acrylate available from UCB Radcure Inc., N. Augusta, SC, as Ebecryl 629 |
| Irgacure 184 | 1-hydroxycyclohexyl phenyl ketone available from Ciba Specialty Chemicals Corporation, Tarrytown, NY, as Irgacure 184 |
| UVI-6974 | Triarylsulfonium hexafluoroantimonate available from Ciba Specialty Chemicals Corporation, Tarrytown, NY, as Cyracure UVI-6974 |
| LiF | Lithium fluoride, 99.85%, available from Alfa Aesar, Ward Hill, MA as product number 36359 |
| MTDATA | 4,4',4''-tris(N-3-methylphenyl-N-phenylamino)triphenylamine, sublimed, available from H. W. Sands Corp., Jupiter, FL, as product number OSA3939 |
| NPD | N,N'-bis(3-naphthalen-2-yl)-N,N'-bis(phenyl)benzidine available from H. W. Sands Corp, Jupiter, FL |
| ITO | Indium tin oxide |
| Fusion D UV Lamp | A UV lamp available from Fusion UV Systems, Gaithersburg, MD, under the trade designation F600 Fusion D UV Lamp |
| Fusion H UV Lamp | A UV lamp available from Fusion UV Systems, Gaithersburg, MD, under the trade designation F600 Fusion H UV Lamp |
| SiAlO | Silicon aluminum oxide |
| OLED | Organic light-emitting diode |
| MEK | Methyl ethyl ketone |
| PET | Polyethylene terephthalate |
| CAG150 | A microgravure coater available from Yasui Seiki Co. (USA), Bloomington, IN, as Model CAG 150 and fitted with a 110R knurl |
| Ag | Silver (target available from Arconium, Providence RI) |
| Thermo-bond 845-EG-2.5 | A hot melt adhesive film available from 3M Company, St. Paul, MN, as Thermo-bond 845-EG with a thickness of 2.5 mils |
| HSPE | A PET film available from Teijin Corp., Japan, as HSPE 100 (thickness = 100 microns) or HSPE 50 (thickness = 50 microns) |
| 8141 Adhesive | An optically clear thin film laminating adhesive available from 3M Company, St. Paul, MN as 3M 8141 |

Any materials for which a source has not been identified in the examples or in the foregoing table may be obtained from Aldrich Chemical Company, Milwaukee, Wis.

Example 1

An OLED device incorporating a protected polymeric film according to the invention was prepared in Example 1. A UV-curable solution was prepared by combining 80 grams Ebecryl 629, 20 grams SR399, and 2 grams Irgacure 184 that had been dissolved in 1000 grams of MEK. The resulting solution was coated onto a roll of 6.5 inch wide HSPE 100 PET film substrate using a CAG 150 microgravure coater operating at 20 ft/min. The coating was subsequently in-line dried at 70° C. and then cured under a nitrogen atmosphere with a Fusion D UV Lamp operating at 100% power. This resulted in a transparent PET film substrate having an approximately 0.7 μm thick transparent coating thereon.

A polymer web mask commercially available from 3M Company under the trade designation Scotchpak 1220 was die cut and then thermally laminated to the coated surface of the PET film substrate using a roll-to-roll laminator. An approximately 35 nm thick layer of ITO, followed by an approximately 10 nm thick layer of Ag, followed by another approximately 35 nm thick layer of ITO were sequentially deposited on the coated surface of the PET film substrate using a DC sputtering process employing a pressure of 1 mTorr, 1 kW of power, and argon and oxygen flow rates of 150 sccm and 6 sccm, respectively, for coating the ITO, and an argon flow rate of 150 sccm for coating the Ag. These coating conditions resulted in a sheet resistance of 10 ohms/square. The ITO layers served as anodes and as robust contacts for the cathodes for the subsequently formed OLED devices.

The polymer mask was then peeled off resulting in a conductive pattern on the PET film substrate. A sample of the conductive patterned substrate measuring 50 mm×50 mm was cut from the roll and contained four pixels each measuring 0.25 cm². The sample was ultrasonically cleaned by sonication in a warm (about 110° F.) detergent solution (Deconex 12 NS, Borer Chemie, Zuchwil, Switzerland) for about 5 minutes, rinsing in warm (about 110° F.) deionized water for about 10 min, and drying in a nitrogen purged oven for at least 4 hours. The ITO/Ag/ITO surface was then plasma treated for 2 minutes at a pressure of 300 mTorr, oxygen flow rate of 500 sccm, and RF power of 400 watts in a plasma treater commercially available from AST, Inc., Billerica, Mass., under the trade designation Model PS 500.

A hole-injecting layer (MTDATA:FTCNQ (2.8% doping)) was vapor deposited at a rate of 1.8 Å/s to a thickness of 3,000

Å on top of the conductive pattern on the PET film substrate. A green emitting OLED stack was then vapor deposited on top of the hole-injecting layer using thermal evaporation in a vacuum chamber at about $5\times10^{-6}$ Torr. More specifically, the OLED stack was provided by the following sequential depositions over the hole-injecting layer: NPD (400 Å, 1 Å/s)/ AlQ:C545T(1% doping, 300 Å, 1 Å/s)/AlQ(200 Å, 1 Å/s)/ LiF(7 Å, 0.5 Å/s)/Al(2500 Å, 25 Å/s).

The OLED devices were then encapsulated by depositing 3,000 Å of $B_2O_3$ on top of the device structure layers using thermal evaporation (about 3-5 Å/s) from a tungsten dimple source (S8A-0.010W, R. D. Mathis, Signal Hill, Calif.) A 2 mil thick protective copper foil was then thermally laminated at a temperature of approximately 80° C. using a hand-operated rubber roller on top of the $B_2O_3$ layer and with Thermobond 845-EG-2.5. The copper foil was large enough to encapsulate the emitting areas of the four pixels, but the edges of the PET film substrate remained exposed to provide a point for electrical contact. For convenience, this is referred as "OLED Device A." Device efficiencies for OLED Device A were measured using a photo-optically corrected silicon photodiode (UDT Sensors, Hawthorne, Calif.).

The effect on device efficiency of incorporating a protected polymeric film according to the invention into OLED Device A was then assessed.

A 3,000 Å thick layer of $B_2O_3$ was deposited on the surface of the PET film substrate opposite the surface on which the device structure had been deposited and using the deposition conditions described above for the previously applied $B_2O_3$ layer.

A multilayer inorganic barrier layer was then prepared by laminating a pair of multilayer assemblies in face-to-face fashion with an optical adhesive. Each assembly comprised six alternating layers of polymer and inorganic material formed on a PET base. When completed, the laminated multilayer inorganic barrier had the following construction: PET base/Polymer 1/SiAlO/Polymer 2/SiAlO/Polymer 2/SiAlO/Optical Adhesive/SiAlO/Polymer 2/SiAlO/Polymer 2/SiAlO/Polymer 1/PET base. Each assembly was formed as described in the following paragraphs.

PET base+Polymer 1 ("Layer 1"). HSPE 50 PET base film was coated with a UV-curable solution that was prepared by mixing 145.5 grams Ebecryl 629, 37.5 grams β-CEA, and 9.03 grams Irgacure 184 that had been dissolved in 972 grams MEK using a CAG-150 microgravure coater operating at 6.1 m/min. The coating was cured using a Fusion H UV Lamp running at 100% power to provide Polymer 1.

SiAlO Layer ("Layer 2"). The PET base film coated with Polymer 1 (i.e., Layer 1) was then loaded into a roll-to-roll sputter coater and the deposition chamber was pumped down to a pressure of $2\times10^{-6}$ Torr. A 60 nm thick SiAlO inorganic oxide layer was deposited atop Polymer 1 by reactively sputtering a Si—Al target (90%-10% Si—Al target commercially available from Academy Precision Materials, Albuquerque, N. Mex.) using 2 kW and 600V, a gas mixture containing 51 sccm argon and 30 sccm oxygen at a pressure of 1 mTorr, and a web speed of 0.43 m/min.

Polymer 2 ("Layer 3"). Using the conditions described for the application and curing of Polymer 1 but with the CAG 150 microgravure coater operating at a speed of 4.6 m/min, the previously applied SiAlO layer was overcoated with a UV-curable solution that was prepared by combining 2.25 grams UVI-6974, 42.75 grams EHPE3150 in 405 grams MEK, and then cured to provide Polymer 2.

Using the same conditions as for Layer 2 and Layer 3, respectively, a second SiAlO layer was deposited atop Layer 3 to form Layer 4, a second layer of Polymer 2 was coated atop Layer 4 to form Layer 5, and a third layer of SiAlO was deposited atop Layer 5 to form Layer 6, thereby providing an assembly having a PET base/Polymer 1/SiAlO/Polymer 2/SiAlO/Polymer 2/SiAlO configuration.

The resulting assembly was split into two rolls and laminated together in face-to-face fashion using 8141 Adhesive and a two-roll laminator to form a multilayer inorganic barrier.

The multilayer inorganic barrier was then laminated to the exposed $B_2O_3$ layer with 8141 Adhesive thereby completing the incorporation of a protected polymeric film into OLED device A. Device efficiencies were measured again and using the same procedure as employed previously. Incorporating a protected polymeric film according to the invention into OLED Device A did not significantly change the efficiency of the resulting device.

Example 2

An OLED device incorporating a protected polymeric film according to the invention was prepared in Example 2. Additional samples of OLED Device A from Example 1 were prepared and the copper foil was edge sealed using a thin bead of epoxy (Araldite 2014 available from Huntsman LLC, Advanced Materials Division, Vantico, East Lansing, Mich.). The epoxy was allowed to cure to hardness over 12 hours in a $N_2$ atmosphere at room temperature. For convenience, this is referred to as "OLED Device B."

An inorganic barrier layer was then prepared according to the following procedure. A UV-curable polymer solution was prepared by combining 2.25 grams UVI-6974 with 42.75 grams EHPE3150 in 405 grams MEK. The resulting solution was coated onto a 6.5 inch wide, 100 micron thick fluorine polyester film commercially available from Ferrania Imaging Technologies, Italy, under the trade designation Arylite using a CAG 150 microgravure coater operating at a speed of 15 ft/min. The coating was subsequently in-line dried at 70° C. and then cured under a nitrogen atmosphere with a Fusion D UV Lamp operating at 100% power. This resulted in a transparent film having an approximately 0.7 μm thick transparent coating thereon.

The coated film was loaded into a sputter coater and the deposition chamber was pumped down to a pressure of $2\times10^{-6}$ Torr. A 60 nm thick SiAlO inorganic oxide layer was deposited using 370 W and 375 V, a gas mixture containing 20 sccm argon and 18 sccm oxygen at a pressure of 6 mTorr, and a web speed of 7 inches/minute. A 90/10 target of Si/Al available from Applied Precision Materials, Albuquerque, N. Mex. was used as the target material.

Inorganic barrier layers were then incorporated into previously prepared samples of OLED Device B to form, respectively, OLED Device B1 and OLED Device B2.

OLED Device B1 was prepared by depositing a 3,000 Å thick layer of $B_2O_3$ on the surface of the PET film substrate opposite the surface on which the device structure had been built. The $B_2O_3$ was deposited using thermal evaporation (~3-5 Å/second) from a tungsten dimple source (S8A-0.010W, R.D. Mathis, Signal Hill, Calif.). The previously prepared inorganic barrier layer was then laminated over the exposed $B_2O_3$ layer using 8141 Adhesive and a two-roll laminator to complete OLED Device B1.

OLED Device B2 was prepared by laminating the previously prepared inorganic barrier layer to the "front side" surface of the PET film substrate (i.e., the surface opposite the surface on which the device structure had been build) by using 8141 Adhesive and a roll-to-roll laminator. Thus, OLED Device B2 differed from OLED Device B1 in that it lacked the $B_2O_3$ layer used on the front side of OLED Device B1.

The samples (OLED Device B1 and OLED Device B2) were stored under ambient conditions. Photographs of the lit devices (i.e., OLED Device B1 and OLED Device B2) were taken periodically to compare dark spot growth. Samples of OLED Device B2 (i.e., without $B_2O_3$ on the front side) showed significantly more dark spot growth over time than samples of OLED Device B1 having the $B_2O_3$ layer on the front side.

The invention is amenable to various modifications and alternative forms, specifics thereof having been shown by way of example in the foregoing drawings and description. It will be understood, however, that the invention is not limited to these particular embodiments. On the contrary, the intention is to cover all modifications, equivalents and alternatives falling within the spirit and scope of the invention, which is defined by the appended claims. Various modifications and equivalent processes, as well as numerous structures to which the present invention may be applicable, will be readily apparent to those of skill in the art to which the present invention is directed.

What is claimed is:

1. A protected polymeric film, consisting of layers arranged in the following order:
    a polymeric film substrate;
    one or more inorganic barrier layers applied to the substrate; and
    a layer of boron oxide applied to the one or more inorganic barrier layers,
    wherein the layer of boron oxide functions as a desiccant in order to absorb moisture and reduce transmission of the moisture through the film.

2. The protected polymeric film of claim 1, wherein the one or more inorganic barrier layers are a multilayer construction.

3. The protected polymeric film of claim 1, wherein the one or more inorganic barrier layers are selected from the group consisting of metals, metal oxides, metal nitrides, metal carbides, metal oxynitrides, metal oxyborides, metal oxycarbides, and combinations thereof.

4. The protected polymeric film of claim 1, having a moisture permeation rate that does not exceed $5\times10^{-4}$ g/m$^2$/day.

5. The protected polymeric film of claim 4, having a moisture permeation rate that does not exceed $1\times10^{-6}$ g/m$^2$/day.

6. A protected polymeric film, consisting of layers arranged in the following order:
    a polymeric film substrate;
    a layer of boron oxide applied to the substrate; and
    one or more inorganic barrier layers applied to the layer of boron oxide,
    wherein the layer of boron oxide functions as a desiccant in order to absorb moisture and reduce transmission of the moisture through the film.

7. A protected polymeric film, consisting of layers arranged in the following order:
    a polymeric film substrate;
    one or more inorganic barrier layers applied to the substrate;
    a layer of boron oxide applied to the one or more inorganic barrier layers;
    a buffer layer applied to the layer of boron oxide,
    wherein the layer of boron oxide functions as a desiccant in order to absorb moisture and reduce transmission of the moisture through the film.

8. The protected polymeric film of claim 7, wherein the buffer layer comprises an organometallic compound or a chelate compound.

9. A protected polymeric film, consisting of layers arranged in the following order:
    a polymeric film substrate;
    a layer of boron oxide applied to the substrate;
    one or more inorganic barrier layers applied to the layer of boron oxide; and
    a buffer layer applied to the one or more inorganic barrier layers,
    wherein the layer of boron oxide functions as a desiccant in order to absorb moisture and reduce transmission of the moisture through the film.

10. The protected polymeric film of claim 9, wherein the buffer layer comprises an organometallic compound or a chelate compound.

* * * * *